United States Patent [19]

Cueman et al.

[11] Patent Number: 5,360,599
[45] Date of Patent: Nov. 1, 1994

[54] CRUCIBLE SUPPORT HEATER FOR THE CONTROL OF MELT FLOW PATTERN IN A CRYSTAL GROWTH PROCESS

[75] Inventors: Michael K. Cueman, Schenectady; Farzin H. Azad, Clifton Park, both of N.Y.

[73] Assignee: General Electric Company, Schenectady, N.Y.

[21] Appl. No.: 79,495

[22] Filed: Jun. 21, 1993

[51] Int. Cl.$^5$ .................................................. B01D 9/04
[52] U.S. Cl. .................................................. 117/217
[58] Field of Search .................. 156/601, 617.1, 618.1, 156/619.1, 620.75; 422/246, 248, 249; 219/210, 420, 427, 433, 434, 436, 458

[56] References Cited

U.S. PATENT DOCUMENTS

| | | | |
|---|---|---|---|
| 3,582,526 | 6/1971 | Seale et al. | 219/75 |
| 3,798,007 | 3/1974 | Bochman et al. | 23/301 SP |
| 3,870,477 | 3/1975 | Labelle, Jr. | 23/301 SP |
| 4,224,100 | 9/1980 | Hartzell | 156/617.1 |
| 4,609,425 | 9/1986 | Mateika et al. | 156/617.1 |
| 4,654,110 | 3/1987 | Morrison | 156/607 |
| 4,659,421 | 4/1987 | Jewett | 156/617.1 |
| 4,687,646 | 8/1987 | Mateika et al. | 422/248 |
| 5,057,489 | 10/1991 | Parker et al. | 505/1 |
| 5,132,091 | 7/1992 | Azad | 422/249 |
| 5,137,699 | 8/1992 | Azad | 422/246 |
| 5,162,072 | 11/1992 | Azad | 422/619.1 |
| 5,223,077 | 6/1993 | Kaneko et al. | 156/620.4 |

Primary Examiner—R. Bruce Breneman
Assistant Examiner—Felisa Garrett
Attorney, Agent, or Firm—Paul R. Webb, II

[57] ABSTRACT

The present invention relates to a crucible support heater for the control of a melt flow pattern within a crucible, and more specifically to controlling a temperature gradient or distribution during crystal growth by the Czochralski method through the use of a heater located in the crucible lift rod.

4 Claims, 5 Drawing Sheets

CRUCIBLE SUPPORT HEATER FOR THE CONTROL OF MELT FLOW PATTERN IN A CRYSTAL GROWTH PROCESS

The following invention was made with government support via contract number DAAL03-91-C0009. The government has certain rights in this invention.

BACKGROUND OF THE INVENTION

Field of the Invention

The present invention relates to a crucible support heater for the control of a melt flow pattern within a crucible, and more specifically to controlling a temperature gradient or distribution during crystal growth by the Czochralski method through the use of a heater located in the crucible lift rod.

The well-known Czochralski method of growing crystals involves contacting a seed crystal with a melt of the crystal material contained in a heated crucible. The growth of large, substantially defect-free crystals by this and other methods remains to this day a difficult task, due to complications brought about by temperature gradients, convective eddies within the melt, and continuously changing thermal conditions.

Previous attempts at controlling the crystal growth process to improve the quality of the crystals produced have primarily involved controlling process parameters, such as, crucible or crystal rotation speeds, crystal pulling rate and total heat supplied to the crucible. The shape and stability of the solidification interface play an important part in achieving substantially defect-free large single crystals, and the shape and stability depend to a large extent on the flow patterns established in the melt. In practice, control of the crystal and crucible rotation rates have been used to attempt to control the flow pattern in the melt. The application of magnetic fields has also been used in attempting to suppress convective eddies within the melt to control the flow pattern, as well.

The above approaches share the disadvantage that the controls tend to produce only bulk effects within the melt. Control or manipulation of the crystal and crucible rotation rates without regard to the prevailing thermal boundary conditions, as has been the practice, leads to inconsistent results. Further, the use of magnetic fields does not guarantee a stable flow regime under the solidification interface.

Heaters disposed below the melt in containers from which single crystals are pulled have heretofore been disclosed. However, these heaters have been designed without the ability to assist in controlling the melt flow pattern in the melt container by selectively controlling and adjusting the thermal gradient across the entire bottom of the vessel. U.S. Pat. No. 4,654,110, issued to Morrison, discloses a shallow angle sheet crystal puller wherein heating rods disposed in the bottom of the melt-containing vessel have gradually increasing (or decreasing) heating capacity to provide a predetermined temperature gradient in the melt. However, there appears to be no means provided by which variation from the single predetermined gradient could be accomplished.

U.S. Pat. No. 4,659,421, issued to Jewett, discloses a shallow pan-type melt container having more than one heater disposed at the bottom of the container. However, these heaters are designed and used in a manner to minimize the effect on melt flow within the melt container. This Jewett patent discusses in detail the recognition of problems associated with melt flow in the Czochralski crystal pulling process. The invention in the Jewett patent is directed to a crystal pulling process which is quite different from the Czochralski method in that neither the crystal nor the melt container is rotated during the pulling process, and melt flow within the container is restricted by baffles, and is desirably kept to a minimum. The only desired melt flow using the apparatus and process in this patent is from below the feedstock area to below the crystal pulling area, and the melt flow is controlled either by the pumping action of the feed rod into the melt or by argon gas pressure in the region surrounding the feed rod. No suggestion is made in this patent to selectively control the thermal gradient across the bottom of a crucible to control the melt flow pattern to assist in controlling the shape of the solidification interface.

Exemplary of prior art which exhibits a control of the thermal gradient across a substantial portion of the bottom of the crucible is commonly assigned U.S. Pat. No. 5,162,072, to Azad. While the Azad patent has met with a degree of commercial success, the contact between the lift mechanism and the bottom of the crucible allows heat to be transferred from the bottom of the crucible to the lift mechanism. This heat loss causes the heater platform to raise the temperature of the bottom of the crucible in order to compensate for the heat loss. This additional heating by the platform heater on the bottom of the crucible may adversely affect the flow pattern of the melt contained within the crucible. Also, the platform heater may not provide the localized heating which is necessary to control the flow pattern of the central portion of the melt. Therefore, a more advantageous system, then, would be presented if the heat loss could be controlled while also controlling the thermal gradients across the bottom of the crucible.

It is apparent from the above that there exists a need in the art for a crystal growth apparatus which is capable of controlling the melt flow, and which at least equals the thermal gradient control characteristics of the crystal growth apparatus, particularly those of the highly advantageous type disclosed in the above-referenced Azad patent, but which at the same time is capable of reducing heat loss through the bottom of the crucible. It is a purpose of this invention to fulfill these and other needs in the art in a manner more apparent to the skilled artisan once given the following disclosure.

SUMMARY OF THE INVENTION

Generally speaking, this invention fulfills these needs by providing a crucible support heater for the control of melt flow in a crystal growth apparatus, comprising a means for containing a melt of material to be grown into a crystal, a means for lifting said means for containing said melt, and a means for heating said melt such that said means for heating said melt are substantially located adjacent to said means for containing said melt and said lifting means whereby an entire bottom of said means for containing said melt is heated by said heating means.

In certain preferred embodiments, the means for containing the melt of material includes a pressure vessel and a crucible. Also, the means for lifting includes a lift rod. Finally, the heating means includes side heaters, pancake heaters and a lift rod heater.

In another further preferred embodiment, the side heater and pancake heater along with the lift rod heater provide a means to maintain favorable temperature gradients and convective flow patterns in the melt of the crystal growth apparatus throughout the growth cycle.

The preferred crystal growth apparatus, according to this invention, offers the following advantages: improved temperature gradients; improved convection flow patterns; improved crystal growth; improved crystal structure; good stability; good durability; ease of crystal formation; and good economy. In fact, in many of the preferred embodiments, these factors of temperature gradients, convective flow patterns, crystal growth, crystal structure, and crystal formation are optimized to an extent that is considerably higher than heretofore achieved in prior, known crystal growth apparatus.

BRIEF DESCRIPTION OF THE DRAWINGS

The above and other features of the present invention which will be more apparent as the description proceeds are best understood by considering the following detailed description in conjunction with the accompanying drawings wherein like character represent like parts throughout the several views and in which.

DETAILED DESCRIPTION OF THE PREFERRED EMBODIMENT

Figure 1:
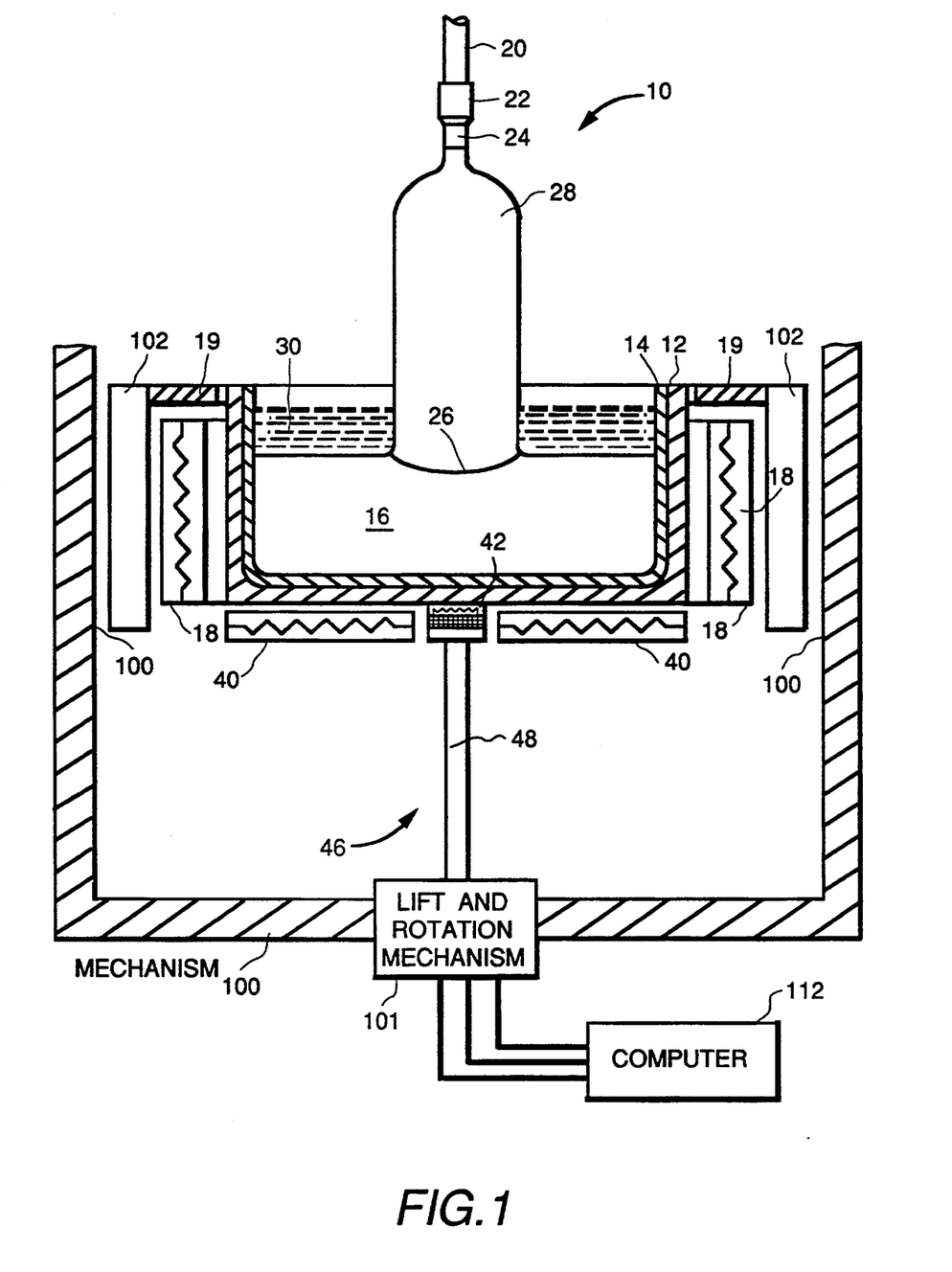
FIG. 1 depicts a cross-sectional elevation view of an apparatus for pulling a single crystal from a melt having a heating means in accordance with a preferred embodiment of the present invention.

Referring initially to FIG. 1, an apparatus, designated by numeral 10, for growing single crystals according to the preferred embodiment of the present invention is shown. This preferred embodiment will be suitable for growing crystals by the Czochralski-type crystal pulling method.

The apparatus 10 comprises a crucible 14 which, in the depicted preferred embodiment, is a close-fitting liner adapted to contain a melt 16 of the material to be pulled into a crystal. Except where indicated later in the specification, crucible 14 is of conventional design, and may be supported in a frame 12 in a stationary manner. The entire apparatus is mounted in a pressure vessel, shown schematically as numeral 100, in a known manner, such that the crucible is capable of being rotated about a central vertical axis and capable of being raised and lowered in the frame by a vertical lift and rotation mechanism, also shown schematically as numeral 101.

The crucible 14 is provided to isolate the melt 16 from the walls of the support 12. At the melt temperatures involved in this crystal growing process, the material from the walls of the crucible is prone to being taken into solution in the melt 16, and therefore tends to contaminate the melt and the crystal grown therefrom. The crucible material is therefore preferably selected, as is known in the art, to be resistant to reaction with the melt at the temperatures experienced during the crystal growing process. Two examples of preferred liner materials are pyrolyric boron nitride, which is preferably used when a gallium-arsenide(Ga-As) melt is being pulled into a Ga-As crystal, and iridium, which is preferably used in pulling Nd-YAG crystals. The outer support of crucible 12 may be made of graphite or other suitable material.

Surrounding the crucible 14 around a circumference thereof, and preferably extending along a predetermined vertical height, is a side heater (or heaters), shown schematically at 18. Examples of such heaters are well known in the art, and the heater may preferably comprise a graphite heater. This external heater 18 is employed to keep the bulk temperature of the melt at a predetermined level. A cylindrical insulation layer 102 and an annular baffle 19 are provided in the depicted preferred embodiment at a location above and around heater 18, the baffle being employed as a barrier to retain the heat generated by heater 18 down at the level of the crucible.

The apparatus 10 further comprises a pulling rod 20, which is preferably adapted to be rotated about its longitudinal axis, and is constructed to be capable of vertical movement at a controlled rate with respect to melt 16. Pulling rod 20 has a chuck 22 disposed at a lower end to which a crystal seed 24 is attached in a manner well known in Czochralski crystal growth methods. As in previously disclosed Czochralski processes, the seed 24 is brought into contact with the melt 16 at an upper central surface of the melt, and the pulling rod 20, chuck 22, and seed 24 are pulled vertically upwardly, and preferably are concurrently rotated in drawing the molten material from the melt. The material solidifies along a solidification front or solid/liquid interface 26, forming a single crystal 28 grown as an extension of the seed 24. The solidification interface 26 is preferably retained at a substantially constant height throughout the crystal pulling process by vertically raising crucible 12 as the upper surface of the melt sinks within the interior of the crucible. Alternatively, the constant height may be maintained by supplying molten material into the crucible at the same rate at which molten material is drawn out and solidified. Methods for supplying the replacement molten material are well known, and do not specifically form a part of the present invention.

Depending upon the particular type of crystal being grown in the process, an encapsulating medium 30 may optionally be provided over the upper surface of the melt 16, as is known in the art. The use of the encapsulating medium has been shown to be effective in containing the elements in the melt in processes in which GaAs crystals are grown. The encapsulating medium is chosen such that it is lighter than the melt so that it will "float" on the surface, so that it will not contaminate the melt, and so that it will isolate the melt from the environment. A typical material employed as an encapsulating medium when growing GaAs crystals would be B₂O₃.

Figure 2:
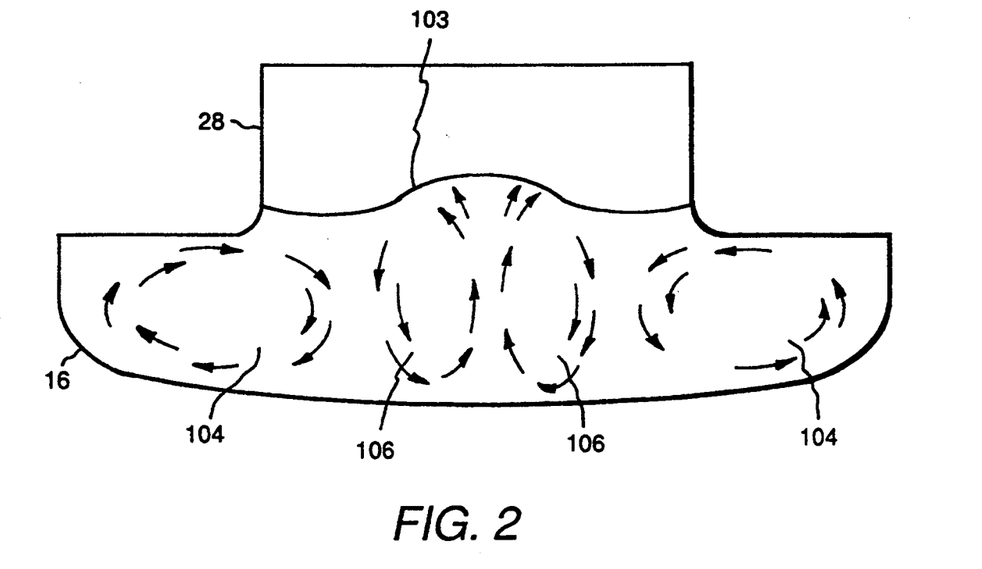
FIG. 2 is a diagrammatic representation of the melt flow conditions and the attendant solidification interface shape in a crucible wherein the melt is undergoing two-cell flow.
Figure 3:
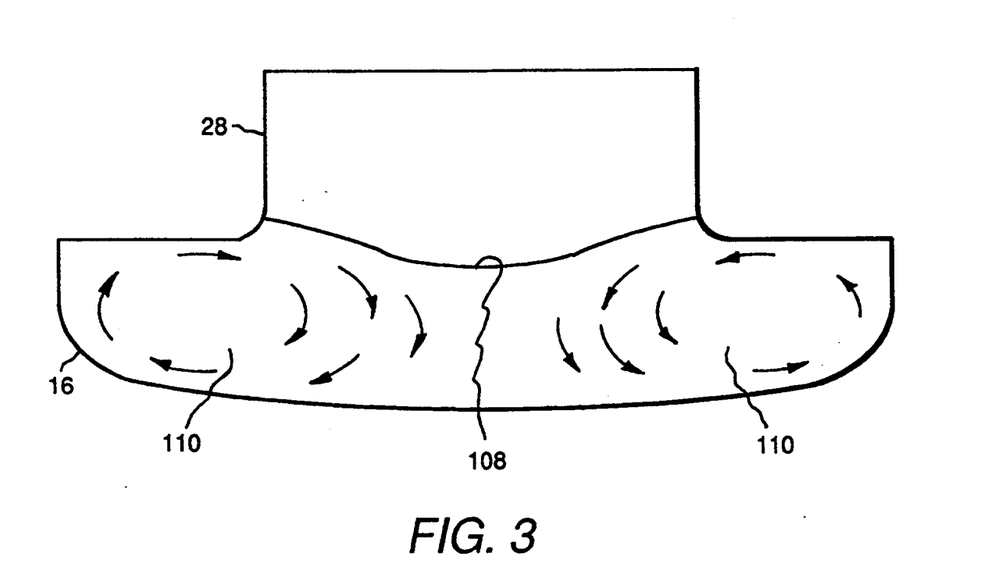
FIG. 3 is a diagrammatic representation of the melt flow conditions and the attendant solidification interface shape in a crucible wherein the melt is undergoing single cell flow in accordance with a preferred embodiment of the present invention.

The flow pattern in the melt 16 has a major influence on the shape and stability of the solidification interface 26. FIG. 2 depicts, in diagrammatic form, a concave solidification interface 103 resulting from what is known in the art as "two-cell" flow, wherein a first cell 104 and a second cell 106 having flow patterns moving in opposite directions form in the melt. FIG. 3 depicts, in diagrammatic form, the desired convex solidification interface 108, which forms when a single-cell flow pattern exists in the melt, wherein only one flow cell 110, moving substantially the entire melt in the pattern depicted, is formed.

In general, the occurrence of two-cell flow takes place when the forces in the melt induced by the rotation of the crystal are of sufficient strength relative to a buoyancy-driven flow and flow driven by crucible rotation, such that the second cell 106 forms as a result of the crystal rotation-induced forces and the first cell 104, having a flow in a different direction, continues as a result of the buoyancy forces, and forces induced by the rotation of the crucible. The second cell 106 tends to cause heated portions of the melt to rise in the manner depicted. The desired single-cell flow is present generally when the buoyancy-driven flow is sufficiently strong to prevent a second cell, representing melt flow in a different direction, from forming. As noted previously, the buoyancy forces decrease relative to the rotation-induced forces as the level of the melt decreases.

Figure 4:
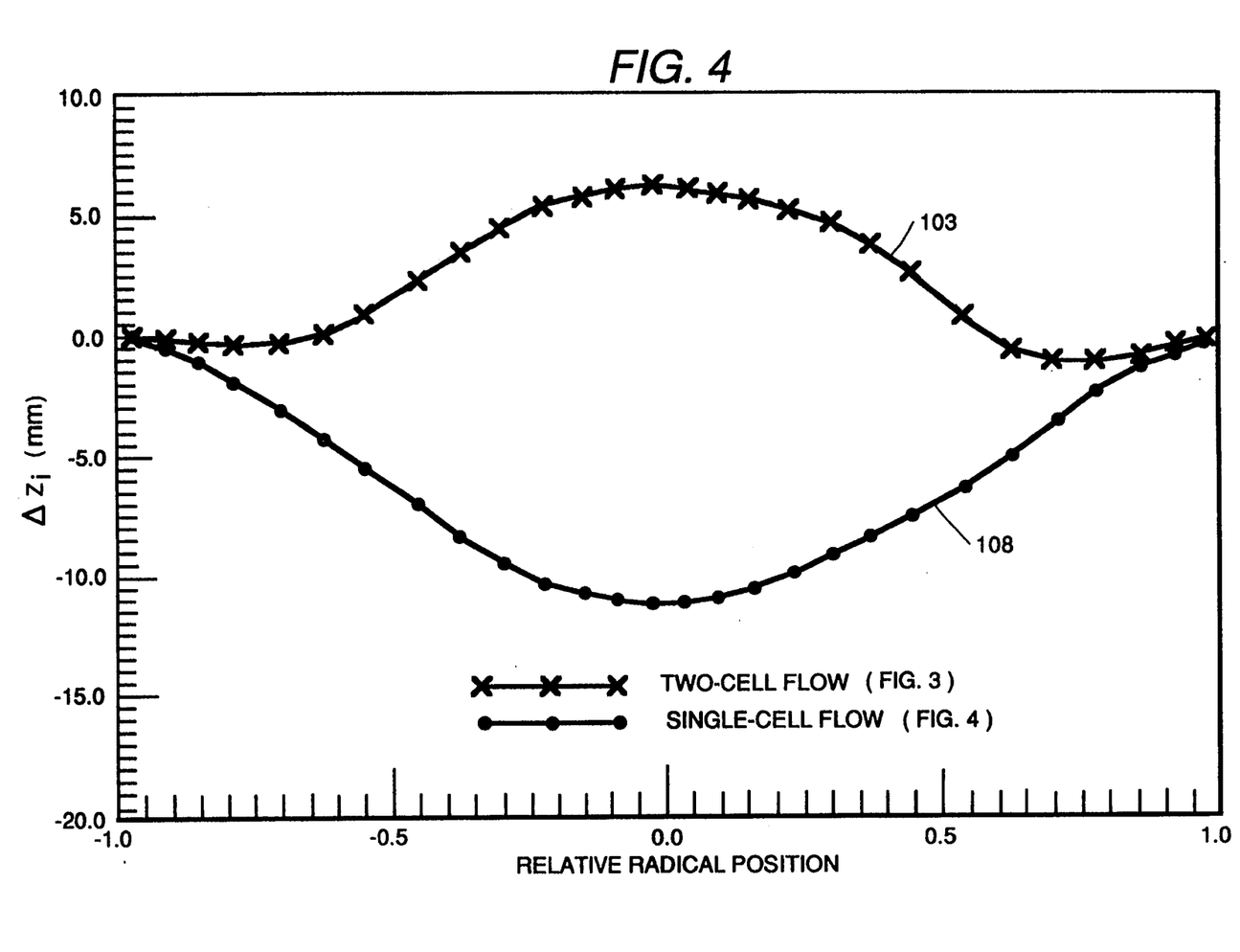
FIG. 4 is a graphical representation of the shape of the liquid-solid interface in the crucible, depicting the solidification interface shape when the melt is undergoing two-cell flow and single-cell flow.

FIG. 4 provides an illustration comprising the two forms of solidification interface shape of interest herein, the term $\Delta Z_i$ referring to a vertical position of the solidification interface relative to a zero point which is the height or vertical position of the interface at the peripheral edge of the crystal being pulled. The vertical position $\Delta Z_i$ is plotted against a radial distance from the centerline of the crystal.

The convex solidification interface shape 108 produced by the single-cell flow pattern is preferred over the concave solidification interface shape 103, as the solidified material forming a crystal at this interface will generally have less induced stress in the crystal lattice, which has the desired result of yielding lower dislocation densities in the crystal. The increased stresses in crystals formed at concave solidification interfaces, resulting in higher dislocation densities, as believed to be present as a result of a greater unevenness in the rates of cooling and solidification across the diameter of the crystal being formed.

Studies leading to the development of the apparatus and method of the present invention have shown that factors such as heat transfer, melt convection and phase change all play a role in the shape of the solidification interface, and that the shape can be predicted taking these factors into account. Analyses conducted have shown that the thermal boundary condition along the bottom the crucible 12 plays a significant role in establishing the flow pattern in the melt in influencing the relative strength of buoyancy forces. Control of the thermal boundary condition can be attained by controlling the temperature gradient across the bottom of the crucible 12 in a radial direction extending outwardly from a centerline of the crucible 12 about which the crucible is rotated. Therefore, in accordance with the preferred embodiment of the invention, the apparatus 10 is provided with a bottom conventional resistive heater 40, preferably in the form of a heater platform 40, and a heater 42 located on lift rod 48 disposed below the crucible and such that heaters 40 and 42 extend across the entire lower surface of crucible 12. Heater platform 40 and heat lift rod heater 42 are designed such that a positive radial temperature gradient can be produced and maintained across the entire lower surface of crucible 12. As a result, the thermal boundary condition along the bottom the crucible may be controlled to yield the desired melt flow pattern.

The purpose of heaters 40 and 42 are to control the surface temperature at the bottom center of crucible 12 which contains the crystal growth melt 16. Adjusting this center point temperature relative to the exterior walls of crucible 12 provides a means of preserving the dominant, single flow convection within crucible 12 as the melt level changes during the crystal growth cycle. This helps preserve the convex melt/crystal interface shape required for good GaAs crystal growth with the Czochralski process.

This design provides three key advantages over conventionally mounted annular and "pancake" multi-zone heaters.

First, it permits direct control of the center temperature of crucible 12. This is not possible with conventional heating units which inevitably have a center hole to accommodate the rod which lifts and turns the crucible. Center temperature control in conventional crystal pullers is approximately achieved by varying the amount of insulation or water cooling of the lift rod.

Second, the rod heater design is less sensitive to the vertical position of the crucible. Crucible 12 is customarily raised during the growth process to maintain the height of the melt as it is depleted by the growth of the crystal. This motion changes the relationship of the crucible to the surrounding heater packages and may undesirably alter the melt flow patterns. Since this invention incorporates the center heater 42 in the lift mechanism 101, the distance between the melt and the heater never changes.

Third, this design provides substantial mechanical simplicity. It does not require an additional penetration of the puller's pressure vessel to provide access for either its power wires or monitoring thermocouples.

The selective control of heaters 40 and 42 to achieve the desired radial temperature gradient may be controlled by programmed commands being developed through the use of simulations or modeling of the melt flow conditions in the crystal pulling process. Alternatively, the control may involve measuring temperatures at a plurality of locations across the radial extent of the crucible by conventional thermocouples (not shown). In the situation wherein thermocouple readings are employed in the control of the temperature gradient, computer 112 is used to receive signals or feedback from heaters 40 and 42 and the computer uses this information, in a closed-loop system configuration, to control heaters 40 and 42 as necessary to achieve and/or maintain the desired radial temperature gradient.

As noted previously in the specification, in many instances the crucible 12 is raised during the course of pulling the crystal 28, in order to maintain upper level of the melt 30, and especially the solidification interface 26, at a substantially constant vertical level. The crucible 12 is thus raised at a rate equal to the drop in the level of the melt due to the melt being extracted into the solidified crystal.

The crucible 12 may be coupled to vertical lift mechanism 101, and the specific lifting means employed may be selected from devices known in the art, for example, a hydraulic system wherein piston-type members, shown schematically at 48 telescope and rotate from cylinder means (not shown) in a manner which will be apparent to those skilled in the art.

By way of non-limiting example, the bottom heater 40 may be used in the following manner in a Czochralski crystal-pulling process. The side heater 18 is the primary heat source for the crucible which maintains the melt in its molten state. The buoyancy forces induced in the melt by side heater 18 tend to create a flow pattern wherein the material at the bottom the crucible 12 moves radially outwardly and then upwardly adjacent to the crucible wall liner 14. The material then flows radially inwardly near an upper level of the melt and then downwardly in a center portion of the crucible. FIG. 3 is representative of this flow pattern. The buoyancy forces acting on the melt vary generally as a function of the height of the melt in the crucible, the buoyancy forces decreasing as the crystal is pulled from the melt and the melt level or height of the melt decreases.

At the start of the crystal pulling process, the buoyancy forces may be sufficiently strong to dominate over forces in the melt induced by the crystal and crucible rotation, which forces tend to create a flow pattern in a direction opposite the direction of the buoyancy force-driven flow pattern. Thus, in the early stages of the process, it may be possible to operate the apparatus with a single-cell flow pattern in the melt without the aid of bottom heater 40 and lift rod heater 42. It is preferred in the present invention to employ the bottom heater 40 and lift rod heater 42 throughout the entire crystal pulling process, in order to ensure from the outset that the desired single-cell flow pattern is maintained in the crucible. However, it is to be understood that with lift rod heater present, the bottom (or pan) heater would be optional.

One preferred usage of bottom heater 40 and lift rod heater 42 is to produce and maintain a positive radial thermal gradient across the bottom of the crucible wherein the temperature of the bottom of the crucible increases in a radial direction from the center of the crucible extending outwardly to the peripheral edge of the bottom of the crucible. It has been determined that such a radial temperature gradient serves to reinforce the buoyancy forces and thus assists in the creation and maintenance of single-cell type flow in the melt. The difference between the temperature at the center of the bottom of crucible 12 and the peripheral edge of crucible 12 may preferably be relatively small when the crystal pulling is commenced due to the ability of the side heater 18 to induce single-cell flow. As the melt level drops during the pulling process, the buoyancy forces induced by side heater 18 become smaller, and in order to compensate for this and to maintain the dominance of the buoyancy driven flow pattern, bottom heater 40 and lift rod heater 42 should be used to selectively adjust (increase) the temperature difference or radial temperature gradient extending from the center of the bottom of crucible 12 to the peripheral edge of the bottom of the crucible by conventional heating techniques. In this manner, the desired single-cell flow pattern can be maintained throughout the entire crystal pulling process.

As indicated previously, a control program may be developed for control computer 112 to provide the control of heater 40 and 42 based on experimental runs or based on process modeling or simulation directed to determining the radial temperature gradient necessary to maintain a single-cell flow pattern as a function of melt level. Such a program would preferably also take into account the rate of crystal growth being employed, in order to ascertain the rate at which the melt level will decrease. Heaters 40 and 42 could therefore be controlled as a function of time, without the necessity of monitoring the actual melt level in the crucible, using this information in the control program.

Figure 5:
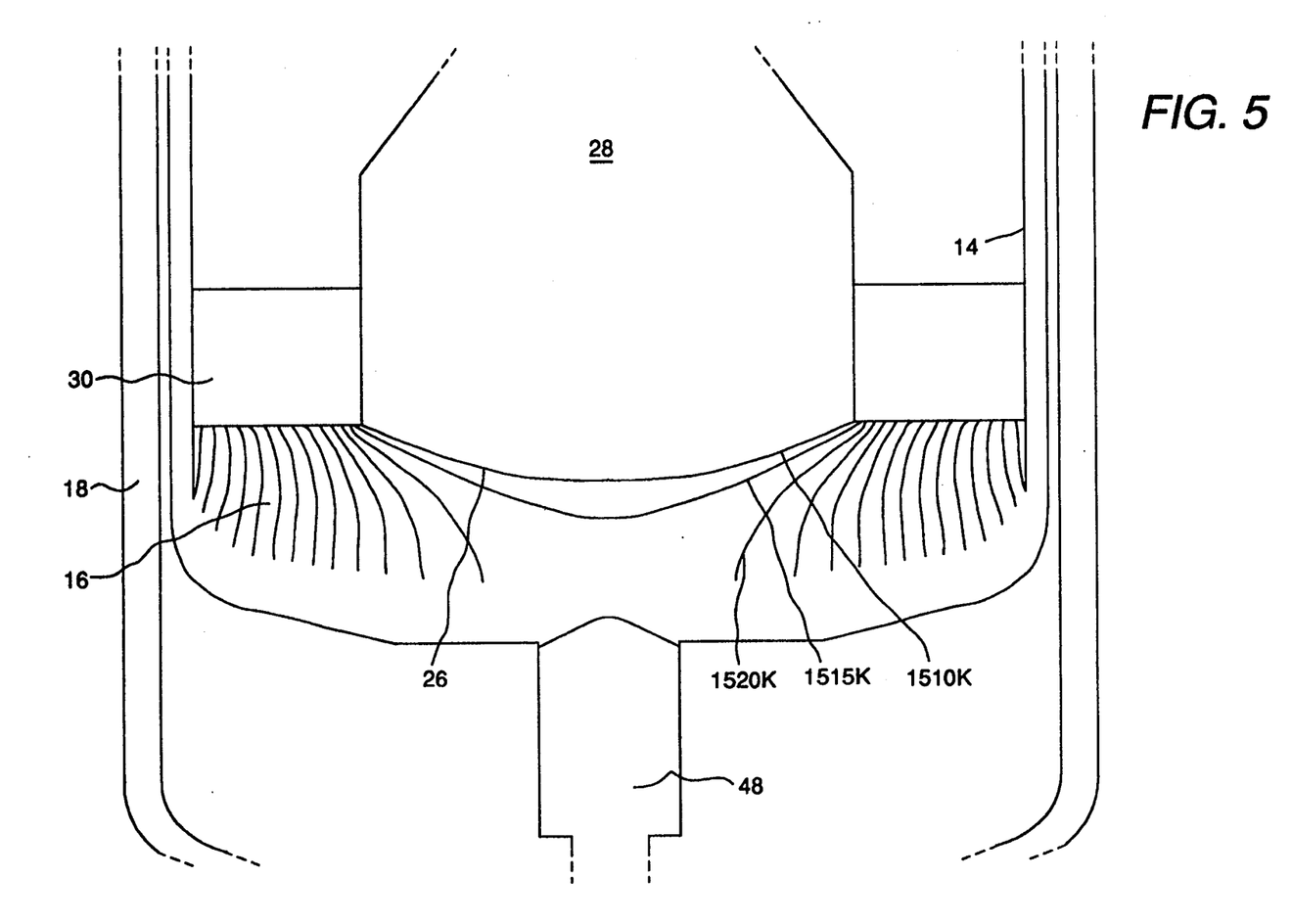
FIG. 5 is a graphical illustration of heat contour lines for a crystal growth apparatus having no bottom heater with heat contour lines drawn at 5° K. intervals.
Figure 6:
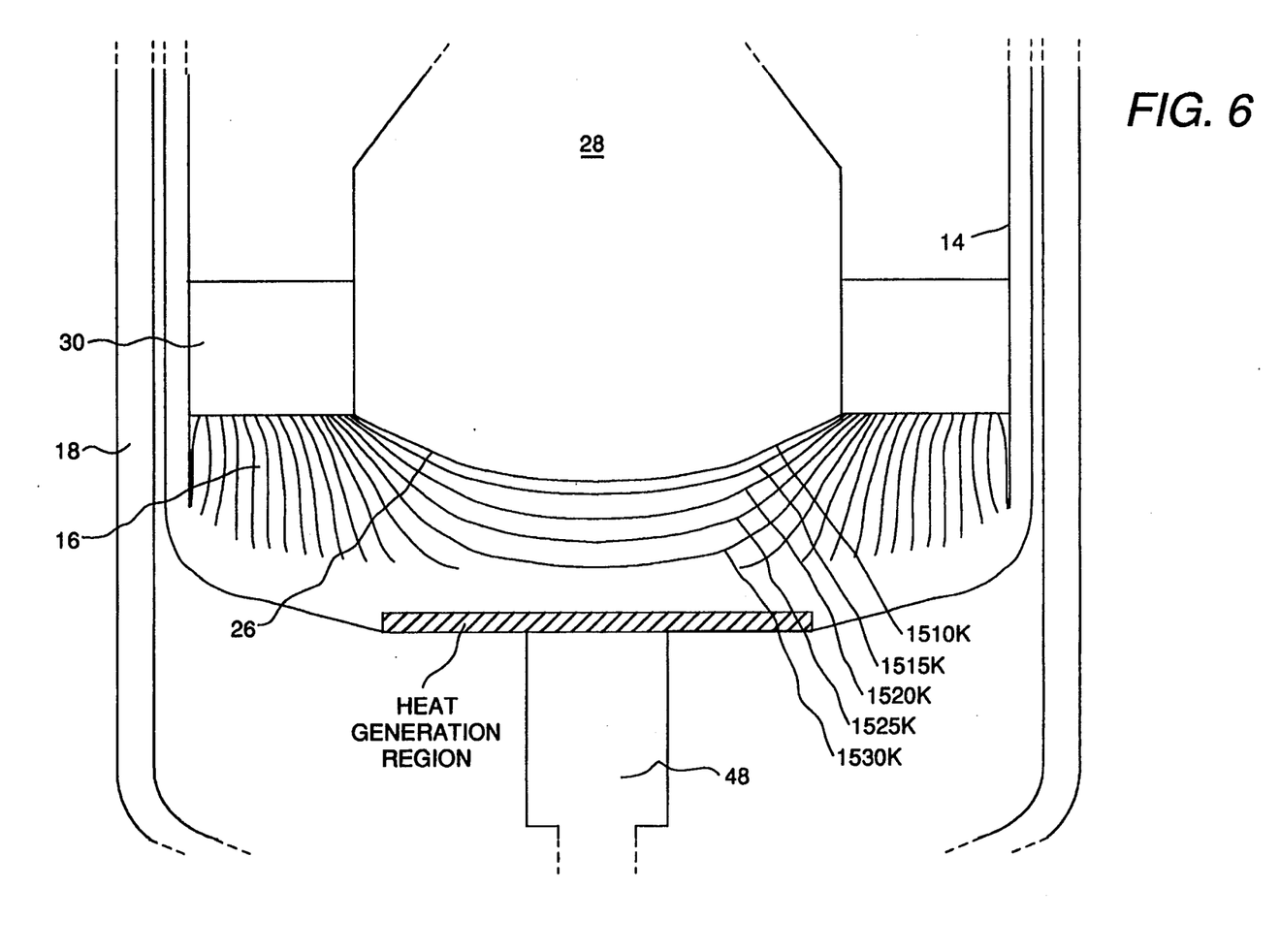
FIG. 6 is a graphical illustration of heat contour lines for a crystal growth apparatus having a bottom heater with heat contour lines drawn at 5° K. intervals.

With respect to FIGS. 5 and 6, FIG. 5 is a graphical illustration of contour heat lines, in the melt 16 between the crucial 14 and the solid/liquid interface 26, drawn at 5° K. intervals for a crystal growth apparatus having no heater in the lift rod. FIG. 6 is a similar graphical illustration but with heat contour lines for the present invention, namely, a crystal growth apparatus having a lift rod heater.

FIG. 5 illustrates, among other things, the solid/liquid interface 26 (See also FIG. 1). It is at this interface 26 that the bottom of the crystal is formed. As can be seen in FIG. 5, the interface 26 is somewhat steep or pointed. This steepness can create undesirable highly mechanical stressed areas in the crystals. Also, the steepness can cause the interface to touch or freeze to the bottom of the crucible which may cause the crystal to "wall" and, ultimately, break. The steepness results in the fact that there are very few, if any, temperature gradients between the interface and the top of the lift rod. The lack of temperature gradients show that the temperature between the interface and the crucible bottom is relatively the same and thus, the interface may continue to grow toward the crucible bottom. Finally, FIG. 5 illustrates that, although side heaters and bottom heaters are commonly used in growing crystals, these heaters are not enough because most of the heat loss is through the lift rod which creates the undesirable steepness in the interface.

In contrast, as shown in FIG. 6, there are several temperature gradients between the interface 26 and the lift rod heat generation region. These gradients reduce the steepness of the crystal interface 26. This reduced steepness reduces the likelihood of freezing or walking. Also, the gradients reduce the mechanical stresses within the crystal. Finally, FIG. 6 shows that the use of a lift rod heater compensates for the heat loss through the lift rod.

Once given the above disclosure, many other features, modification or improvements will become apparent to the skilled artisan. Such features, modifications or improvements are, therefore, considered to be a part of this invention, the scope of which is to be determined by the following claims.

What is claimed is:

1. A crucible support heater for the control of melt flow in a crystal growth apparatus, wherein said heater is comprised of:

a means for containing a melt of material to be grown into a crystal;

a means for lifting said means for containing said melt, said lifting means including a lift rod disposed below said means for containing said melt; and a means for heating said melt such that said means for heating said melt are in part located adjacent to said means for containing said melt and are in part located on said lift rod of said lifting means whereby an entire bottom of said means for containing said melt is heated by said heating means.

2. The heater, as in claim 1, wherein said heating means is further comprised of:
a cooling means.

3. The heater, as in claim 2, wherein said cooling means is further comprised of:
a water flow cooling means.

4. The heater, as in claim 2, wherein said heating means for said lifting means is further comprised of:
a resistance heater.

* * * * *